United States Patent
Lee et al.

(10) Patent No.: US 7,102,441 B2
(45) Date of Patent: Sep. 5, 2006

(54) VARIABLE GAIN AMPLIFYING CIRCUIT

(75) Inventors: Chao Cheng Lee, Hsin-Chu (TW); Ying Yao Lin, Yilan (TW)

(73) Assignee: Realtek Semiconductor Corp., (TW)

( * ) Notice: Subject to any disclaimer, the term of this patent is extended or adjusted under 35 U.S.C. 154(b) by 0 days.

(21) Appl. No.: 11/148,132

(22) Filed: Jun. 8, 2005

(65) Prior Publication Data

US 2005/0225393 A1    Oct. 13, 2005

Related U.S. Application Data

(63) Continuation-in-part of application No. 10/748,667, filed on Dec. 31, 2003.

(30) Foreign Application Priority Data

Jun. 14, 2004  (TW) ................................ 93117032 A

(51) Int. Cl.
*H03G 3/10* (2006.01)
(52) U.S. Cl. ...................................... 330/284; 330/254
(58) Field of Classification Search ................ 330/284, 330/254, 260
See application file for complete search history.

(56) References Cited

U.S. PATENT DOCUMENTS

| | | | | |
|---|---|---|---|---|
| 3,735,393 | A | * | 5/1973 | Carbrey ...................... 341/127 |
| 3,863,200 | A | | 1/1975 | Miller |
| 5,201,009 | A | * | 4/1993 | Yamada et al. ............. 381/104 |
| 5,408,199 | A | * | 4/1995 | Nagano et al. ............. 330/284 |
| 5,525,985 | A | | 6/1996 | Schlotterer et al. |
| 5,999,052 | A | * | 12/1999 | Tang .......................... 330/254 |
| 6,127,893 | A | * | 10/2000 | Llewellyn et al. .......... 330/284 |
| 6,175,278 | B1 | * | 1/2001 | Hasegawa ................... 330/278 |
| 6,545,534 | B1 | * | 4/2003 | Mehr .......................... 330/69 |
| 6,703,682 | B1 | | 3/2004 | Aswell |

* cited by examiner

*Primary Examiner*—Patricia Nguyen

(57) ABSTRACT

A variable gain amplifying circuit, which applies a resistor ladder to obtain a more precise gain, is disclosed. The amplifying circuit includes an input, an operational amplifier (op-amp), a resistor unit and a feedback resistor. The feedback resistor is coupled between an output and an inverting input of the op-amp. The resistor unit includes at least one resistor ladder. The resistor unit further includes a switching unit for controlling whether the at least one resistor ladder is coupled between the input of the amplifying circuit and the inverting input of the op-amp. A differential amplifying circuit for more precise gain adjustment is also disclosed.

13 Claims, 4 Drawing Sheets

US 7,102,441 B2

VARIABLE GAIN AMPLIFYING CIRCUIT

REFERENCE TO RELATED APPLICATIONS

This application is a continuation-in-part of application with Ser. No. 10/748,667, filed Dec. 31, 2003, now U.S. Pub. No. 2004/0232981.

BACKGROUND OF THE INVENTION (a). Field of the Invention

The present invention relates in general to an electronic circuit, and more particularly to an amplifying circuit with a variable gain.

(b). Description of the Prior Arts

In modem circuit design, it is often necessary to provide the signal amplifying function with high accuracy. For example, in a common modulation mechanism for wireless communication, I/Q signals are used in phase modulation or frequency modulation. However, as long as the amplitude of the I/Q signals has a slight mismatch, the constellation diagram of the signals would be damaged, and the bit error rate (BER) of the communication system would also be increased. Thus, an amplifier with a highly precise gain is needed to accurately control the amplitude of the I/Q signals.

The gain drift of a conventional open-loop amplifier is rather large, so it cannot meet the requirement of highly precise gain. It is also difficult for a common closed-loop amplifier to precisely control its gain. FIG. 1 is a circuit diagram of a conventional closed-loop amplifier, which includes an operational amplifier (op-amp) 10, a resistor $R_1$ coupled between the input of the whole circuit and the inverting input of the op-amp 10, and a feedback resistor $R_2$ coupled between the output of the whole circuit and the inverting input of the op-amp 10. $V_{in}$ and $V_{out}$ are the input voltage and output voltage respectively. Since the properties of negative feedback and "virtual short", the gain ($V_{out}/V_{in}$) of the amplifying circuit in FIG. 1 can be derived as $-R_2/R_1$. By adjusting the resistor values of $R_1$ and $R_2$, a required gain is obtained. However, if a highly precise gain is required, e.g. 1.001, then the gain accuracy may be easily affected by a slight error of the resistor values of $R_1$ and $R_2$ since the difference between the values of $R_1$ and $R_2$ is rather small (e.g. $R_1$=1 k ohm, $R_2$=(1 k+1) ohm). In particular, when the amplifying circuit of FIG. 1 is implemented on an integrated circuit (IC), it is more difficult to achieve a highly precise gain since the factors of temperature, manufacturing process, supply voltage drift, etc. cannot be completely controlled.

SUMMARY OF THE INVENTION

In view of this, an object of the present invention is to provide a variable gain amplifying circuit that employs a resistor ladder architecture for precise gain control.

Another object of the present invention is to provide a variable gain amplifying circuit that can compensate a gain mismatch resulted from the factors of temperature, manufacturing process, supply voltage drift, etc.

Accordingly, the present invention provides a variable gain amplifying circuit which includes an input end, an operational amplifier (op-amp), a resistor device, and a feedback resistor. The op-amp includes a first input, a second input, and an output. The feedback resistor is coupled between the output and the first input of the op-amp. The resistor device includes at least one resistor ladder and a switching unit for controlling whether the at least one resistor ladder is coupled between the first input of the op-amp and the input end.

In another aspect, the present invention provides a differential amplifying circuit with a variable gain that includes a first input end, a second input end, a differential operational amplifier, a first resistor device, a second resistor device, a first feedback resistor and a second feedback resistor. The differential op-amp includes a first input, a second input, a first output and a second output. The first feedback resistor is coupled between the second output and the first input, and the second feedback resistor is coupled between the first output and the second input.

Further, the first resistor device includes at least one first resistor ladder, and a first switching unit for controlling whether the at least one first resistor ladder is coupled between the first input and the first input end. The second resistor device includes at least a second resistor ladder, and a second switching unit for controlling whether the second resistor ladder is coupled between the second input and the second input end.

DETAILED DESCRIPTION OF THE PRESENT INVENTION

The present invention employs resistor ladders to adjust the resistor value of a closed-loop amplifying circuit, thereby achieving the goal of precise gain control. The circuit structure and principle of the resistor ladder is described below first.

Figure 1:
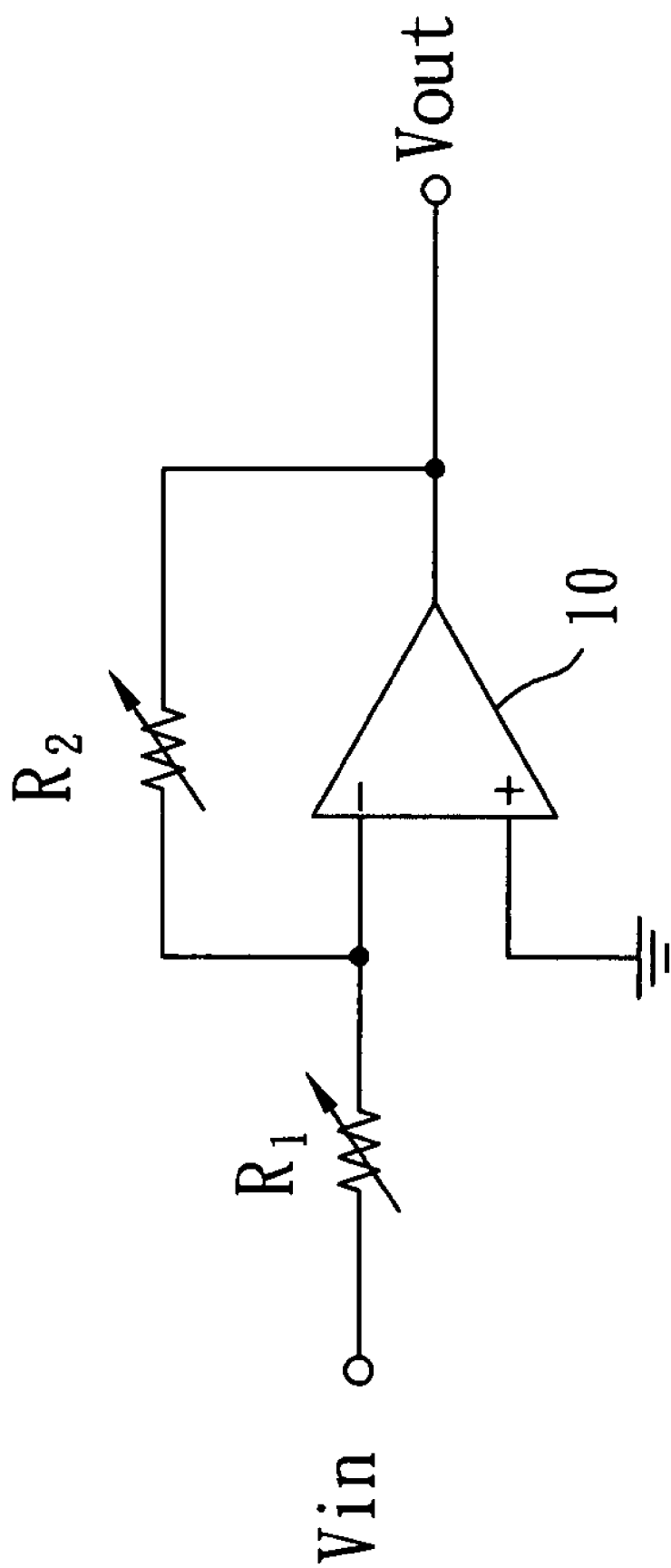
FIG. 1 is a circuit diagram of a conventional closed-loop amplifier
Figure 2:
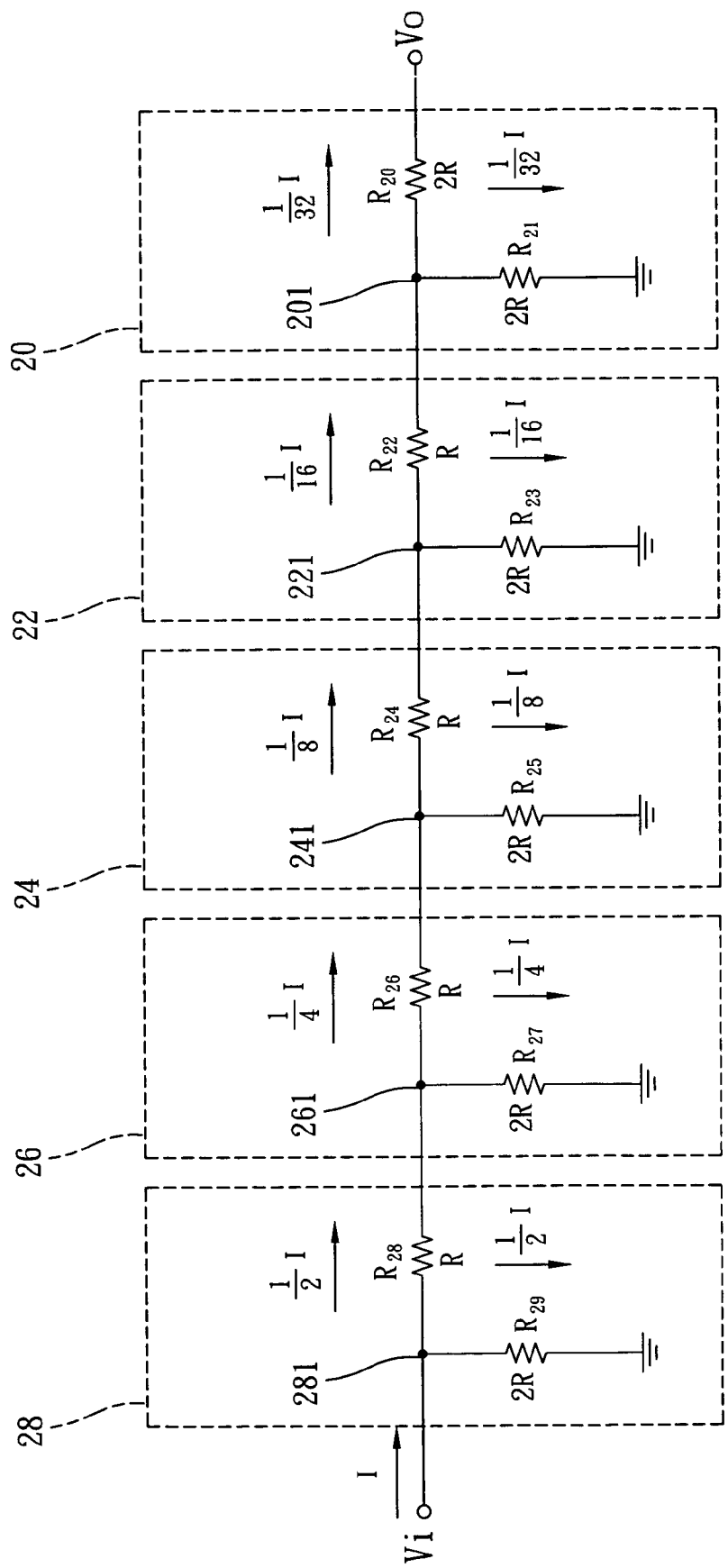
FIG. 2 is a circuit structure diagram of a 5-step resistor ladder.

FIG. 2 is a circuit structure diagram of a 5-step resistor ladder, wherein each of the five steps (i.e. blocks 20, 22, 24, 26 and 28) contains a node (denoted as 201, 221, 241, 261 and 281 respectively) and two current paths. One of the current paths is coupled to ground, and the other is coupled to the node of the next step. In FIG. 2, the relation between the resistor values is not limited originally. However, for the sake of brevity, values of the resistors $R_{20}$, $R_{21}$, $R_{23}$, $R_{25}$, $R_{27}$ and $R_{29}$ are selected as twice of those of the resistors $R_{22}$, $R_{24}$, $R_{26}$ and $R_{28}$. That is, the resistor ladder in FIG. 2 is a 5-bit R-2R resistor network, whose equivalent circuit is derived as follows: the resistors $R_{20}$ and $R_{21}$, are parallel connected to obtain a resistor value of 1R, and further serially connected with $R_{22}$ to obtain an equivalent impedance 2R. Next, the equivalent impedance 2R is parallel connected with $R_{23}$... and so on. Therefore, the impedances of the two current paths at the nodes 281, 261, 241, 221 and 201 are both 2R. After a current I is inputted to an input node $V_i$, the current would be decreased to one half when passing through each node. The current flowing at each resistor is shown in FIG. 2. Since the resistor ladder in FIG. 2 has five steps, the current outputted to the output $V_o$ is $I/2^5$ if $V_o$ is real ground or virtual ground and it means that the equivalent impedance of the resistor ladder is $2^5 \times R$. It can be deduced from above that the equivalent impedance of a n-bit R-2R resistor network is $2^n \times R$.

Figure 3:
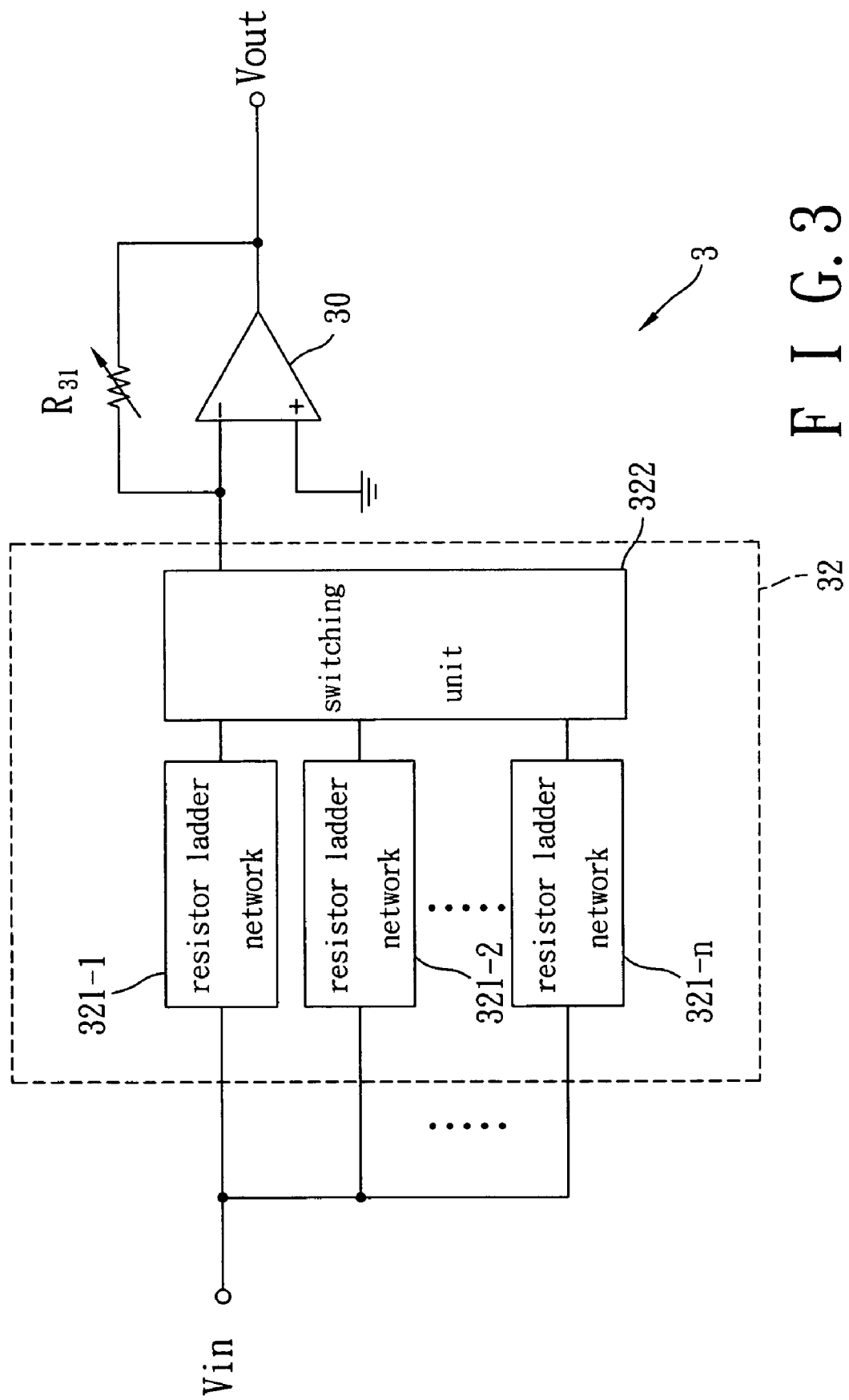
FIG. 3 is a circuit diagram of a preferred embodiment of a variable gain amplifying circuit according to the present invention.

Next, it is described how to apply the resistor ladder to the variable gain amplifying circuit of the present invention. FIG. 3 is a circuit diagram of a preferred embodiment of the variable gain amplifying circuit according to the present invention. As shown in FIG. 3, the amplifying circuit 3 includes an operational amplifier (op-amp) 30, a resistor device 32 and a feedback resistor $R_{31}$. The amplifying circuit 3 has a negative-feedback configuration, that is, the non-inverting input of the op-amp 30 is coupled to ground, and the feedback resistor $R_{31}$ is coupled between the output and the inverting input of the op-amp 30. In addition, an input voltage $V_{in}$ is provided to the inverting input of the op-amp 30 via the resistor device 32.

In FIG. 3, the resistor device 32 includes n parallel-connected resistor ladders 321-1 to 321-n and a switching unit 322. The resistor ladder 321-1 is a 1-bit R-2R resistor network, the resistor ladder 321-2 is a 2-bit R-2R resistor network . . . and so on. The switching unit 322 can control whether the resistor ladders 321-1 to 321-n are connected to the inverting input of the op-amp 30, thereby adjusting the equivalent impedance of the whole resistor device 32. The amplifying circuit 3 also includes a control circuit (not shown) which can generate a control signal to control the operation of the switching unit 322.

According to the above explanation about the R-2R resistor network in FIG. 2, we can deduce that the equivalent impedance of the resistor device 32 in FIG. 3 is $$R\left(\frac{1}{2} + \frac{1}{2^2} + \frac{1}{2^3} + \ldots + \frac{1}{2^n}\right)$$

If the value of the feedback resistor $R_{31}$ is $m \times R$, then the gain of the amplifying circuit 3 is $$\frac{V_{out}}{V_{in}} = -m \times \left(\frac{1}{2} + \frac{1}{2^2} + \frac{1}{2^3} + \ldots + \frac{1}{2^n}\right) \qquad \text{Eq (1-1)}$$

Each term in the right of Eq (1-1) can be reserved or deleted by using the switching unit 322. In this manner, the gain of the amplifying circuit 3 can be adjusted precisely. A larger n (i.e. bit number of the R-2R resistor network within the resistor device 32 is larger) would bring a more precise gain for the amplifying circuit 3.

If a term in the right of Eq (1-1) is to be deleted, then the R-2R resistor network corresponding to the term can be directly omitted. For example, if the required gain range lies between 1 and 1.25, then the impedance of the feedback resistor $R_{31}$ can be configured as 2R, and both terms of $(\frac{1}{2}^2)$ and $(\frac{1}{2}^3)$ in Eq (1-1) need to be deleted according to Eq (1-1). Therefore, the 2-bit and 3-bit R-2R resistor networks 321-2 and 321-3 can be omitted. Besides, if there is one or more terms in Eq (1-1) are determined to be reserved, the R-2R resistor network(s) corresponding to the reserved term(s) can be replaced by an equivalent resistor unit so as to save the area of the amplifying circuit 3 while maintaining original gain accuracy.

In another embodiment, the amplifying circuit 3 is implemented on an integrated circuit (IC).

It is notable that the resistor ladders 321-1 to 321-n in the embodiment of FIG. 3 are not limited to R-2R resistor networks. Those skilled in the art can make slight change and modification on the resistor ladder architecture easily. For example, the resistor ratio of the two current paths in each step of the resistor ladder can be configured as a ratio other than 1:2. Any embodiment, where the gain of the amplifying circuit can be controlled in a similar manner to Eq (1-1), would not lie outside the spirit and scope of the present invention.

Figure 4:
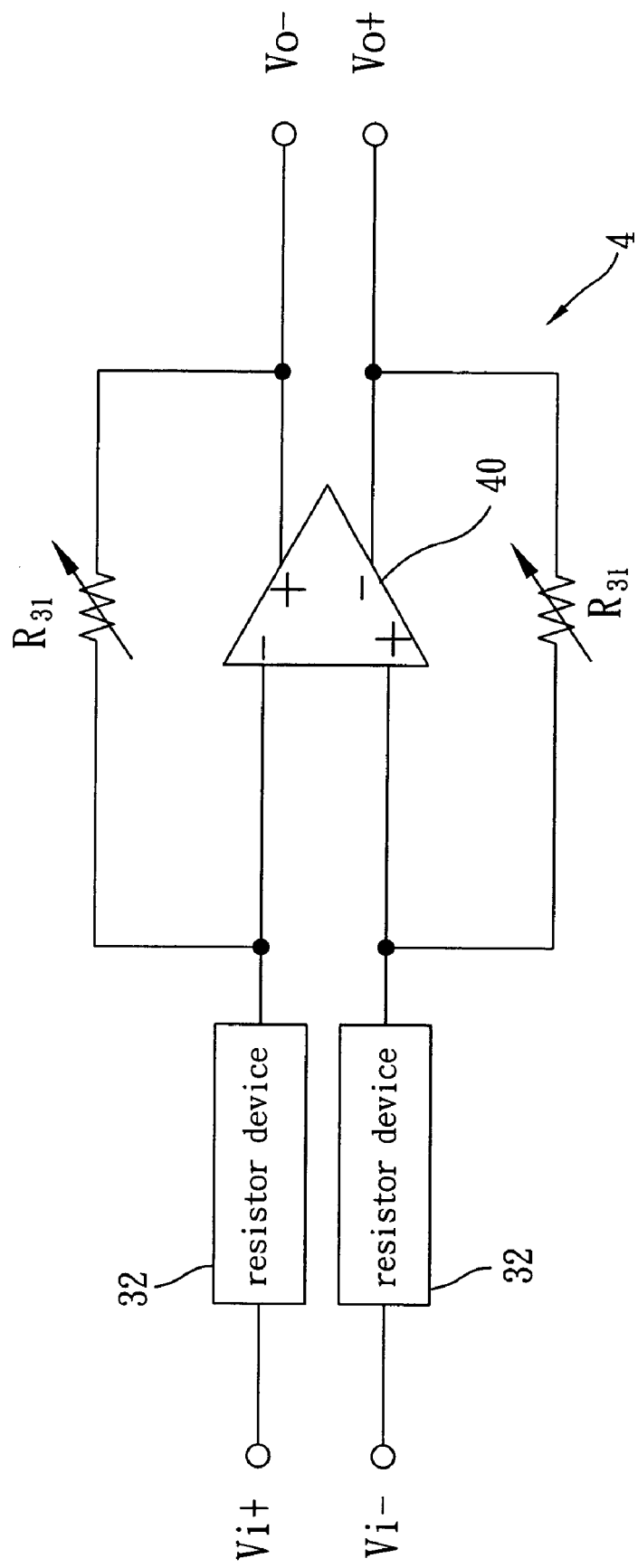
FIG. 4 is a circuit diagram of a preferred embodiment of a differential amplifying circuit with a variable gain according to the present invention.

The present invention can also be applied to the configuration of a differential amplifying circuit. FIG. 4 is a circuit diagram of a preferred embodiment of a differential amplifying circuit with a variable gain according to the present invention. As shown in FIG. 4, the differential amplifying circuit 4 includes a differential operational amplifier 40. Two feedback resistors $R_{31}$ are respectively coupled between the non-inverting output and the inverting input of the differential op-amp 40, and between the inverting output and the non-inverting input of the differential op-amp 40. In addition, an input voltage $V_{i+}$ is provided to the inverting input via a resistor device 32, and an input voltage $V_{i-}$ is provided to the non-inverting input via another resistor device 32. It is notable that, in the embodiment of FIG. 4, equivalent impedances of the two resistor devices 32 are the same, and impedances of the two feedback resistors $R_{31}$ are also the same.

Since the resistor device 32 and feedback resistor $R_{31}$, in FIG. 4 are the same as those in FIG. 3, the gain of the differential amplifying circuit 4 can be derived according to the virtual short property of the differential op-amp 40, that is, $$\frac{V_{o-} - V_{o+}}{V_{i-} - V_{i+}} = -m \times \left(\frac{1}{2} + \frac{1}{2^2} + \frac{1}{2^3} + \ldots + \frac{1}{2^n}\right) \qquad \text{Eq (1-2)}$$

Similar to Eq (1-1), each term in the right of Eq (1-2) can be reserved or deleted by using the switching unit 322 in the resistor device 32. The differential amplifying circuit 4 also includes a control circuit (not shown) for generating a control signal to control the operation of the switching unit 322. In this manner, the gain can be adjusted precisely. A larger n (i.e. bit number of the R-2R resistor network within the resistor device 32 is larger) would bring a more precise gain for the differential amplifying circuit 4.

In another embodiment, the differential amplifying circuit 4 is implemented on an integrated circuit (IC).

While the present invention has been shown and described with reference to the preferred embodiments thereof and in terms of the illustrative drawings, it should not be considered as limited thereby. Various possible modifications and alterations could be conceived of by one skilled in the art to the form and the content of any particular embodiment, without departing from the scope and the spirit of the present invention.

What is claimed is:

1. An amplifying circuit with a variable gain, the circuit comprising:
   an input end;
   an operational amplifier comprising a first input, a second input, and an output end;
   at least one resistor ladder;
   a resistor parallel coupled to the at least one resistor ladder, wherein the resistor comprises a second resistor ladder;
   a switching unit, coupled to the at least one resistor ladder, for controlling whether the at least one resistor ladder is coupled between the first input of the operational amplifier and the input end; and a feedback resistor, coupled between the output and the first input of the operational amplifier.

2. The circuit of claim 1, wherein the resistor ladder is an R-2R resistor network.

3. The circuit of claim 1, wherein the variable gain of the amplifying circuit is adjusted by the switching unit.

4. The circuit of claim 3, further comprising:
a control circuit, coupled to the switching unit, for generating a control signal to control an operation of the switching unit.

5. The circuit of claim 1, further comprising:
a control circuit, coupled to the switching unit, for generating a control signal to adjust the variable gain of the amplifying circuit.

6. An amplifying circuit with a variable gain, the circuit comprising:
an input end;
an operational amplifier comprising a first input, a second input, and an output;
a resistor device comprising:
a first resistor ladder;
a second resistor ladder; and
a switching unit for respectively controlling whether the first and second resistor ladders are coupled between the first input of the operational amplifier and the input end; and
a feedback resistor, coupled between the output and the first input of the operational amplifier.

7. The circuit of claim 6, wherein the resistor ladders are R-2R resistor networks.

8. The circuit of claim 6, wherein a number of steps of the first resistor ladder is unequal to that of the second resistor ladder.

9. The circuit of claim 6, wherein the variable gain of the circuit is adjusted by the switching unit.

10. The circuit of claim 9, further comprising:
a control circuit, coupled to the switching unit, for generating a control signal to control an operation of the switching unit.

11. The circuit of claim 6, wherein the circuit is implemented on an integrated circuit.

12. The circuit of claim 6, further comprising:
a control circuit, coupled to the switching unit, for generating a control signal to adjust the variable gain of the amplifying circuit.

13. The circuit of claim 6, wherein the resistor device further comprises:
a resistor parallel coupled to the first and the second resistor ladders.

* * * * *